(12) United States Patent
Hasebe et al.

(10) Patent No.: US 8,080,290 B2
(45) Date of Patent: Dec. 20, 2011

(54) FILM FORMATION METHOD AND APPARATUS FOR SEMICONDUCTOR PROCESS

(75) Inventors: Kazuhide Hasebe, Yamanashi (JP); Nobutake Nodera, Osaka (JP); Masanobu Matsunaga, Yamanashi (JP); Jun Satoh, Yamanashi (JP); Pao-Hwa Chou, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 350 days.

(21) Appl. No.: 12/320,018

(22) Filed: Jan. 14, 2009

(65) Prior Publication Data
US 2009/0191722 A1 Jul. 30, 2009

(30) Foreign Application Priority Data
Jan. 19, 2008 (JP) .................................. 2008-009926

(51) Int. Cl.
*H05H 1/24* (2006.01)
*C23C 16/00* (2006.01)
(52) U.S. Cl. .......................... 427/579; 427/578; 438/792
(58) Field of Classification Search .................. None
See application file for complete search history.

(56) References Cited

U.S. PATENT DOCUMENTS

| 5,874,368 | A | 2/1999 | Laxman et al. | |
|---|---|---|---|---|
| 6,165,916 | A | 12/2000 | Muraoka et al. | |
| 6,730,614 | B1 * | 5/2004 | Lim et al. | 438/763 |
| 2002/0031618 | A1 * | 3/2002 | Sherman | 427/569 |
| 2002/0140041 | A1 * | 10/2002 | Endoh | 257/400 |
| 2003/0109107 | A1 * | 6/2003 | Hsieh et al. | 438/303 |
| 2003/0231684 | A1 * | 12/2003 | Yagi et al. | 372/46 |
| 2004/0147199 | A1 * | 7/2004 | Hirano | 445/24 |
| 2005/0255712 | A1 * | 11/2005 | Kato et al. | 438/791 |
| 2006/0286817 | A1 | 12/2006 | Kato et al. | |
| 2007/0234953 | A1 * | 10/2007 | Kaushal et al. | 118/323 |

FOREIGN PATENT DOCUMENTS

| JP | 2-93071 | 4/1990 |
|---|---|---|
| JP | 6-45256 | 2/1994 |
| JP | 2006-49809 | 2/2006 |
| JP | 2007-138295 | 6/2007 |

OTHER PUBLICATIONS

Japanese Office Action issued on Sep. 6, 2011 for Application No. 2008-009926 with English translation.

* cited by examiner

*Primary Examiner* — Timothy Meeks
*Assistant Examiner* — Joseph Miller, Jr.
(74) *Attorney, Agent, or Firm* — Smith, Gambrell & Russell, LLP (57) ABSTRACT

A film formation method is used for forming a silicon nitride film on a target substrate by repeating a plasma cycle and a non-plasma cycle a plurality of times, in a process field configured to be selectively supplied with a first process gas containing a silane family gas and a second process gas containing a nitriding gas and communicating with an exciting mechanism for exciting the second process gas to be supplied. The method includes obtaining a relation formula or relation table that represents relationship of a cycle mixture manner of the plasma cycle and the non-plasma cycle relative to a film quality factor of the silicon nitride film; determining a specific manner of the cycle mixture manner based on a target value of the film quality factor with reference to the relation formula or relation table; and arranging the film formation process in accordance with the specific manner.

12 Claims, 7 Drawing Sheets

FILM FORMATION METHOD AND APPARATUS FOR SEMICONDUCTOR PROCESS

BACKGROUND OF THE INVENTION

1. Field of the Invention

The present invention relates to a film formation method and apparatus for a semiconductor process for forming a silicon nitride film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), and SOG (Spin On Glass), $Si_3N_4$ (silicon nitride). Particularly, silicon nitride films are widely used, because they have better insulation properties as compared to silicon oxide films, and they can sufficiently serve as etching stopper films or inter-level insulating films. Further, for the same reason, carbon nitride films doped with boron are sometimes used.

Several methods are known for forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachlorodisilane (HCD: $Si_2Cl_6$), bistertialbutylaminosilane (BTBAS: $SiH_2(NH(C_4H_9))_2$), or $(t-C_4H_9NH)_2SiH_2$, is used as a silicon source gas. For example, a silicon nitride film is formed by thermal CVD using a gas combination of $SiH_2Cl_2+NH_3$ (see U.S. Pat. No. 5,874,368 A) or $Si_2Cl_6+NH_3$. Further, there is also proposed a method for doping a silicon nitride film with an impurity, such as boron (B), to decrease the dielectric constant.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 2-93071 and No. 6-45256 and U.S. Pat. No. 6,165,916 A). In general, this film formation process is called ALD (Atomic Layer Deposition) or MLD (Molecular Layer Deposition), which allows a predetermined process to be performed without exposing wafers to a very high temperature.

For example, where dichlorosilane (DCS) and $NH_3$ are supplied as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a film formation method and apparatus for a semiconductor process, which can control a film quality factor of a silicon nitride film with high accuracy.

According to a first aspect of the present invention, there is provided a film formation method for a semiconductor process for performing a film formation process to form a silicon nitride film on a target substrate, in a process field inside a process container configured to be selectively supplied with a first process gas containing a silane family gas and a second process gas containing a nitriding gas and communicating with an exciting mechanism for exciting the second process gas to be supplied, the film formation process being arranged to repeat a plasma cycle and a non-plasma cycle a plurality of times in the process field with the target substrate placed therein to laminate thin films formed by respective times on the target substrate, thereby forming a silicon nitride film with a predetermined thickness, wherein each of the plasma cycle and the non-plasma cycle comprises a first supply step of performing supply of the first process gas to the process field while maintaining a shut-off state of supply of the second process gas to the process field, and a second supply step of performing supply of the second process gas to the process field while maintaining a shut-off state of supply of the first process gas to the process field, the plasma cycle is a cycle in which the second supply step comprises an excitation period of supplying the second process gas to the process field while exciting the second process gas by the exciting mechanism, and the non-plasma cycle is a cycle in which the second supply step comprises no period of exciting the second process gas by the exciting mechanism, and the method comprising: obtaining a relation formula or relation table that represents relationship of a cycle mixture manner of the plasma cycle and the non-plasma cycle relative to a film quality factor of the silicon nitride film; determining a specific manner of the cycle mixture manner based on a target value of the film quality factor with reference to the relation formula or relation table; and arranging the film formation process in accordance with the specific manner and then executing the film formation process.

According to a second aspect of the present invention, there is provided a film formation apparatus for a semiconductor process, comprising: a process container having a process field configured to accommodate a target substrate; a support member configured to support the target substrate inside the process field; a heater configured to heat the target substrate inside the process field; an exhaust system configured to exhaust gas from the process field; a first process gas supply circuit configured to supply a first process gas containing a silane family gas to the process field; a second process gas supply circuit configured to supply a second process gas containing a nitriding gas to the process field; an exciting mechanism configured to excite the second process gas to be supplied; and a control section configured to control an operation of the apparatus, wherein the control section is preset to perform a film formation process to form a silicon nitride film on the target substrate in the process field, the film formation process being arranged to repeat a plasma cycle and a non-plasma cycle a plurality of times in the process field with the target substrate placed therein to laminate thin films formed by respective times on the target substrate, thereby forming a silicon nitride film with a predetermined thickness, wherein each of the plasma cycle and the non-plasma cycle comprises a first supply step of performing supply of the first process gas to the process field while maintaining a shut-off state of supply of the second process gas to the process field, and a second supply step of performing supply of the second process gas to the process field while maintaining a shut-off state of supply of the first process gas to the process field, the plasma cycle is a cycle in which the second supply step comprises an excitation period of supplying the second process gas to the process field while exciting the second process gas by the exciting mechanism, and the non-plasma cycle is a cycle in which the second supply step comprises no period of exciting the second process gas by the exciting mechanism, and the control section being preset to access a storage section to retrieve data stored therein concerning a relation formula or relation table that represents relationship of a cycle mixture manner of the plasma cycle and the non-plasma cycle relative to a film quality factor of the silicon nitride film; to determine a specific manner of the cycle mixture manner based on a target value of the film quality factor with reference to the relation formula or relation table; and to arrange the film formation process in accordance with the specific manner and then execute the film formation process.

According to a third aspect of the present invention, there is provided a computer readable medium containing program instructions for execution on a processor, which is used for a film formation apparatus for a semiconductor process including a process field inside a process container configured to be selectively supplied with a first process gas containing a family gas and a second process gas containing a nitriding gas and communicating with an exciting mechanism for exciting the second process gas to be supplied, wherein the program instructions, when executed by the processor, cause the film formation apparatus to perform a film formation process to form a silicon nitride film on a target substrate within the process field, the film formation process being arranged to repeat a plasma cycle and a non-plasma cycle a plurality of times in the process field with the target substrate placed therein to laminate thin films formed by respective times on the target substrate, thereby forming a silicon nitride film with a predetermined thickness, wherein each of the plasma cycle and the non-plasma cycle comprises a first supply step of performing supply of the first process gas to the process field while maintaining a shut-off state of supply of the second process gas to the process field, and a second supply step of performing supply of the second process gas to the process field while maintaining a shut-off state of supply of the first process gas to the process field, the plasma cycle is a cycle in which the second supply step comprises an excitation period of supplying the second process gas to the process field while exciting the second process gas by the exciting mechanism, and the non-plasma cycle is a cycle in which the second supply step comprises no period of exciting the second process gas by the exciting mechanism, and the program instructions further cause a control section of the film formation apparatus to access a storage section to retrieve data stored therein concerning a relation formula or relation table that represents relationship of a cycle mixture manner of the plasma cycle and the non-plasma cycle relative to a film quality factor of the silicon nitride film; to determine a specific manner of the cycle mixture manner based on a target value of the film quality factor with reference to the relation formula or relation table; and to arrange the film formation process in accordance with the specific manner and then execute the film formation process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems of conventional techniques for semiconductor processes, in relation to methods for forming a silicon nitride film. As a result, the inventors have arrived at the findings given below.

Specifically, as described previously, there is a conventional technique arranged to utilize so-called ALD or MLD film formation and to generate plasma by use of radio frequency (RF) when supplying $NH_3$ gas as a nitriding gas, thereby promoting the nitridation reaction. As compared to a process performed without plasma, this process can improve the film formation rate (film formation speed). Further, this process can improve the mobility of electrons or holes by increasing the stress of the deposited silicon nitride film and thereby improve the quality of the deposited silicon nitride film to a large extent. Further, it is known that a silicon nitride film of this kind is effectively usable for the charge trap layer of a memory cell (Jpn. Pat. Appln. KOKAI Publication No. 2006-156626).

In recent years, owing to the demands of increased miniaturization and integration of semiconductor integrated circuits, silicon nitride films are required to have higher quality in a accurately controlled state. Conventionally, the quality of silicon nitride films is controlled by use of the temperature, pressure, gas flow rate, and so forth as parameters. In this respect, it has been found by the present inventors that, where ALD or MLD film formation is performed, some of the film quality factors can be reliably controlled by use of the cycle mixture manner of a plasma cycle and a non-plasma cycle as a parameter.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
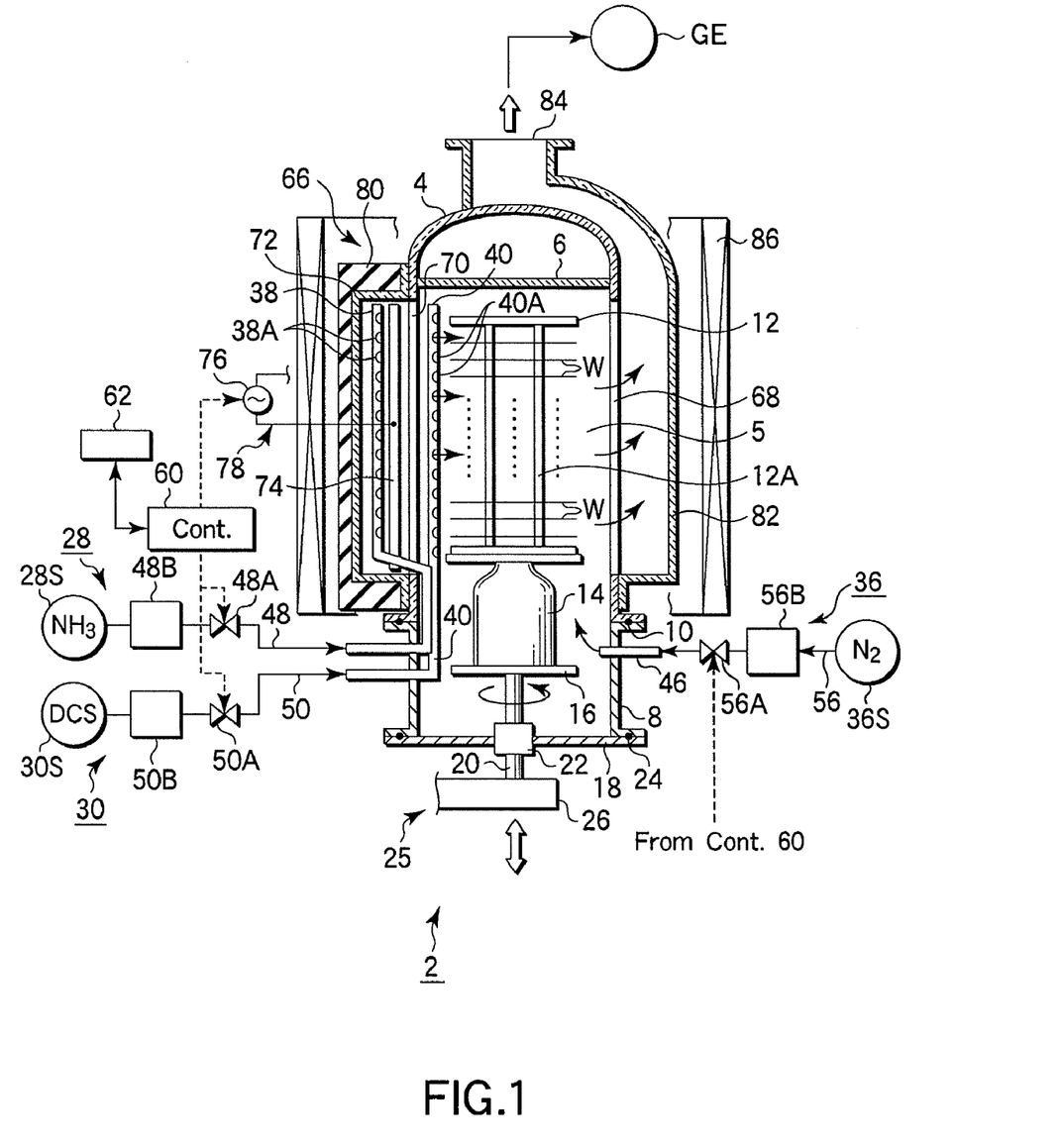
FIG. 1 is a sectional view showing a film formation apparatus (vertical CVD apparatus) according to an embodiment of the present invention.
Figure 2:
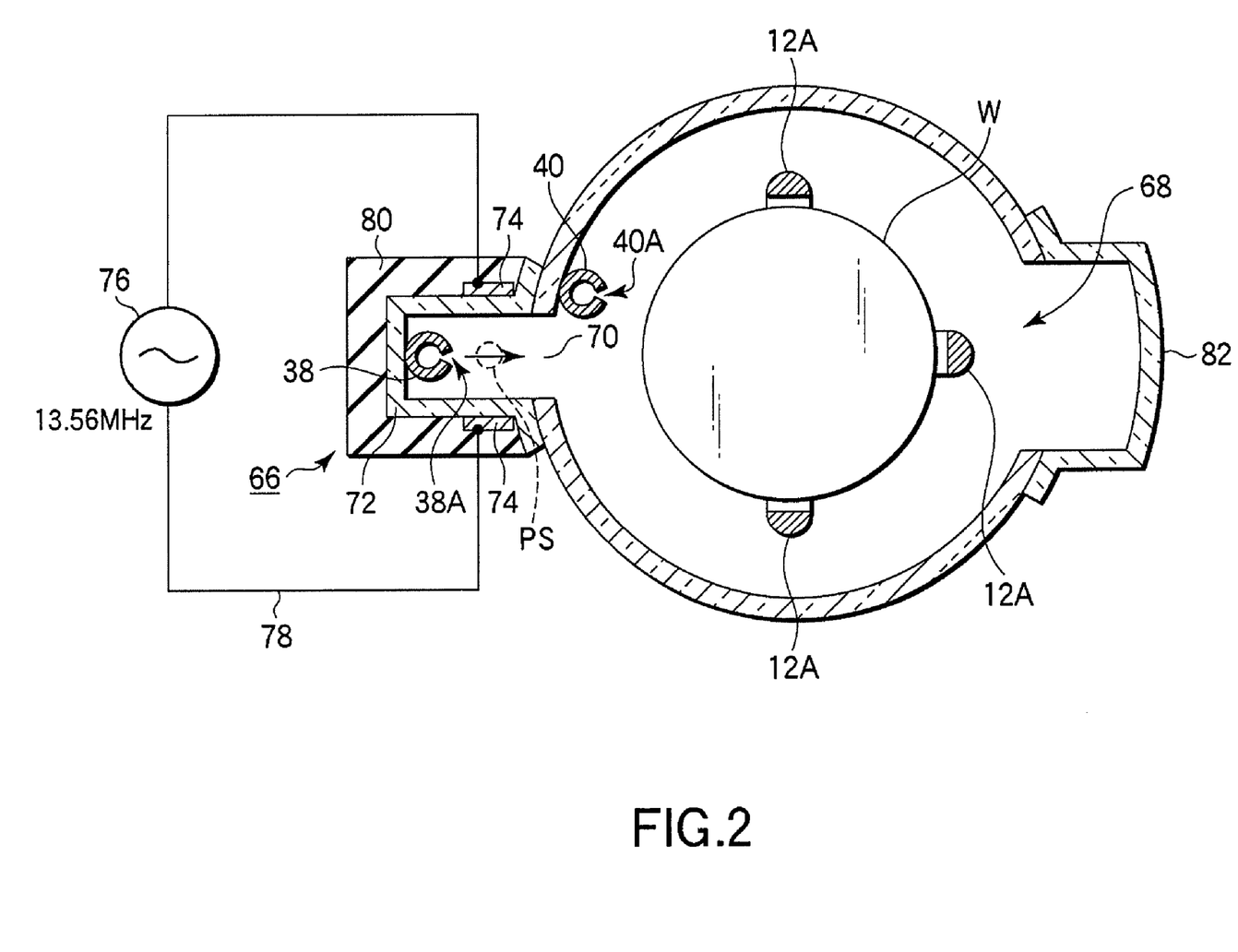
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, and a second process gas containing ammonia ($NH_3$) gas as a nitriding gas. The film formation apparatus 2 is configured to form a silicon nitride film on target substrates in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a purge gas supply circuit 36. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The purge gas supply circuit 36 is arranged to supply an inactive gas, such as $N_2$ gas, as a purge gas. Each of the first and second process gases is mixed with a suitable amount of carrier gas, as needed. However, such a carrier gas will not be mentioned, hereinafter, for the sake of simplicity of explanation.

More specifically, the second and first process gas supply circuits 28 and 30 include gas distribution nozzles 38 and 40, respectively, each of which is formed of a quartz pipe which penetrates the sidewall of the manifold 8 from the outside and then turns and extends upward (see FIG. 1). The gas distribution nozzles 38 and 40 respectively have a plurality of gas spouting holes 38A and 40A, each set of holes being formed at predetermined intervals in the longitudinal direction (the vertical direction) over all the wafers W on the wafer boat 12. Each set of the gas spouting holes 38A and 40A deliver the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 38, 40, and 46 are connected to gas sources 28S, 30S, and 36S of $NH_3$ gas, DCS gas, and $N_2$ gas, respectively, through gas supply lines (gas passages) 48, 50, and 56, respectively. The gas supply lines 48, 50, and 56 are provided with switching valves 48A, 50A, and 56A and flow rate controllers 48B, 50B, and 56B, such as mass flow controllers, respectively. With this arrangement, $NH_3$ gas, DCS gas, and $N_2$ gas can be supplied at controlled flow rates.

A gas exciting section 66 is formed on the sidewall of the process container 4 in the vertical direction. On the side of the process container 4 opposite to the gas exciting section 66, a long narrow exhaust port 68 for vacuum-exhausting the inner atmosphere is formed by cutting the sidewall of the process container 4 in, e.g., the vertical direction.

Specifically, the gas exciting section 66 has a vertically long narrow opening 70 formed by cutting a predetermined width of the sidewall of the process container 4, in the vertical direction. The opening 70 is covered with a quartz cover (plasma generation box) 72 airtightly connected to the outer surface of the process container 4 by welding. The cover 72 has a vertical long narrow shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long narrow electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is selectively excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas is disposed. Specifically, the gas distribution nozzle 40 extends upward on one side of the outside of the opening 70 (in the process container 4). The first process gas containing DCS gas is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

The film formation apparatus 2 further includes a main control section 60 formed of, e.g., a computer, to control the entire apparatus. The main control section 60 can control a film formation process as described below in accordance with process recipes stored in the storage section 62 thereof in advance, with reference to the film thickness and composition of a film to be formed. In the storage section 62, the relationship between the process gas flow rates and the thickness and composition of the film is also stored as control data in advance. Accordingly, the main control section 60 can control the elevating mechanism 25, gas supply circuits 28, 30, and 36, exhaust system GE, gas exciting section 66, heater 86, and so forth, based on the stored process recipes and control data. Examples of a storage medium are a magnetic disk (flexible disk, hard disk (a representative of which is a hard disk included in the storage section 62), etc.), an optical disk (CD, DVD, etc.), a magneto-optical disk (MO, etc.), and a semiconductor memory.

Next, an explanation will be given of a film formation method (so called ALD or MLD film formation) performed in the apparatus shown in FIG. 1. In this film formation method, a silicon nitride film is formed on semiconductor wafers by ALD or MLD. In order to achieve this, a first process gas containing dichlorosilane (DCS) gas as a silane family gas and a second process gas containing ammonia ($NH_3$) gas as a nitriding gas are selectively supplied into the process field 5 accommodating wafers W. Specifically, a film formation process is performed along with the following operations.

<Film Formation Process>

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first and second process gases are intermittently supplied from the respective gas distribution nozzles 40 and 38 at controlled flow rates.

The first process gas containing DCS gas is supplied from the gas spouting holes 40A of the gas distribution nozzle 40 to form gas flows parallel with the wafers W on the wafer boat 12. While being supplied, the DCS gas is activated by the heating temperature to the process field 5, and molecules of the DCS gas and molecules and atoms of decomposition products generated by decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. When the second process gas is supplied, the gas exciting section 66 is set in the ON-state or OFF-state, depending on plasma and non-plasma cycles, as described later.

When the gas exciting section 66 is set in the ON-state, the second process gas is excited and partly turned into plasma when it passes through the plasma generation area PS between the pair of electrodes 74. At this time, for example, radicals (activated species), such as $N^*$, $NH^*$, $NH_2^*$, and $NH_3^*$, are produced (the symbol [*] denotes that it is a radical). On the other hand, when the gas exciting section 66 is set in the OFF-state, the second process gas passes, mainly as gas molecules, through the gas exciting section 66. The radicals or gas molecules flow out from the opening 70 of the gas exciting section 66 toward the center of the process container 4, and are supplied into gaps between the wafers W in a laminar flow state.

Radicals derived from the $NH_3$ gas excited by plasma or molecules of the $NH_3$ gas and molecules and atoms of decomposition products generated by decomposition due to activation by the heating temperature to the process field 5 react with molecules and so forth of DCS gas adsorbed on the surface of the wafers W, so that a thin film is formed on the wafers W. Alternatively, when the DCS gas flows onto radicals derived from the $NH_3$ gas or molecules and atoms of decomposition products derived from the $NH_3$ gas and adsorbed on the surface of the wafers W, the same reaction is caused, so a silicon nitride film is formed on the wafers W. When the gas exciting section 66 is set in the ON-state, the film formation is developed at an increased reaction rate. On the other hand, when the gas exciting section 66 is set in the OFF-state, the film formation is developed at a decreased reaction rate.

Figure 3A:
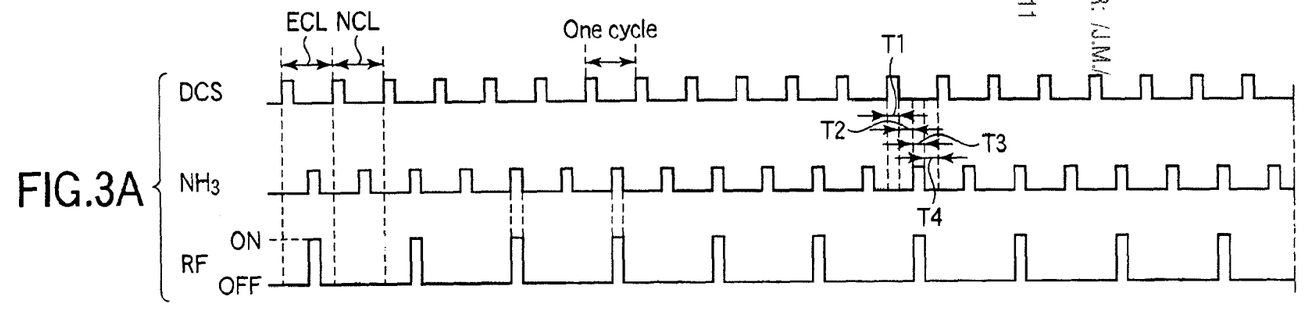
FIG. 3A is a timing chart showing the gas supply and RF (radio frequency) application of a film formation method according to an embodiment of the present invention.

FIG. 3A is a timing chart showing the gas supply and RF (radio frequency) application of a film formation method according to an embodiment of the present invention. FIG. 3A shows conditions in part of the whole period of a film formation process performed on one batch of wafers. As shown in FIG. 3A, the film formation method according to this embodiment repeats a plasma cycle ECL and a non-plasma cycle NCL mixedly, such as alternately one by one as in this example, a plurality of times. The plasma cycle ECL is a cycle in which the second process gas containing $NH_3$ gas is subjected to plasma excitation by the gas exciting section 66. The non-plasma cycle NCL is a cycle in which the second process gas is not subjected to plasma excitation by the gas exciting section 66. Each of the plasma and non-plasma cycles ECL and NCL is formed of first to fourth steps T1 to T4. Accordingly, a cycle comprising the first to fourth steps T1 to T4 is repeated a number of times, and thin films of silicon nitride formed by respective cycles are laminated, thereby arriving at a silicon nitride film having a target thickness.

Specifically, the first step T1 is arranged to perform supply of the first process gas (denoted as DCS in FIG. 3A) to the process field 5, while maintaining the shut-off state of supply of the second process gas (denoted as $NH_3$ in FIG. 3A) to the process field 5. The second step T2 is arranged to maintain the shut-off state of supply of the first and second process gases to the process field 5. The third step T3 is arranged to perform supply of the second process gas to the process field 5, while maintaining the shut-off state of supply of the first process gas to the process field 5. The fourth step T4 is arranged to maintain the shut-off state of supply of the first and second process gases to the process field 5.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while maintaining the shut-off state of supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first and second process gases. However, where supplying each of the first and second process gases is performed along with vacuum-exhausting the process container 4, the interior of the process container 4 can be continuously vacuum-exhausted over the entirety of the first to fourth steps T1 to T4.

In the third step T3 of the plasma cycle ECL, the RF power supply 76 is set in the ON-state to turn the second process gas into plasma by the gas exciting section 66, so as to supply the second process gas in an activated state to the process field 5. In the third step T3 of the non-plasma cycle NCL, the RF power supply 76 is set in the OFF-state not to turn the second process gas into plasma by the gas exciting section 66, while supplying the second process gas to the process field 5. However, the heating temperature set by the heater 86 to the process field 5 remains the same in the plasma and non-plasma cycles ECL and NCL, i.e., it is essentially not changed depending on these cycles.

In FIG. 3A, the first step T1 is set to be within a range of about 2 to 10 seconds, the second step T2 is set to be within a range of about 5 to 15 seconds, the third step T3 is set to be within a range of about 10 to 20 seconds, and the fourth step T4 is set to be within a range of about 5 to 15 seconds. In the plasma cycle ECL, the film thickness obtained by one cycle of the first to fourth steps T1 to T4 is about 0.13 nm. In the non-plasma cycle NCL, the film thickness obtained by one cycle of the first to fourth steps T1 to T4 is about 0.09 nm. Accordingly, for example, where the target film thickness is 50 nm, the cycle is repeated about 455 times. However, these values of time and thickness are merely examples and thus are not limiting. FIG. 3A merely shows 20 cycles out of such 455 cycles for the sake of simplicity in understanding the invention.

The third step T3 of the plasma cycle ECL may be modified in relation to the ON-state of an RF power supply in the $NH_3$ gas supply step. For example, in a modification, halfway through the third step T3, the RF power supply 76 is set in the ON-state to supply the second process gas in an activated state to the process field 5 during a sub-step T3*b*. Specifically, in this case, the RF power supply 76 is turned on after a predetermined time Δt passes, to turn the second process gas into plasma by the gas exciting section 66, so as to supply the second process gas in an activated state to the process field 5 during the sub-step T3*b*. The predetermined time Δt is defined as the time necessary for stabilizing the flow rate of $NH_3$ gas, which is set at, e.g., about 5 seconds. Since the RF power supply is turned on to generate plasma after the flow rate of the second process gas is stabilized, the uniformity of radical concentration among the wafers W (uniformity in the vertical direction) is improved.

Figure 4A:
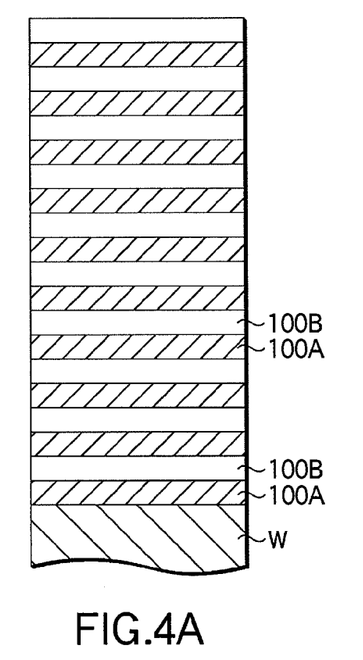
FIGS. 4A, 4B, 4C, and 4D are sectional views showing the laminated state of a silicon nitride film formed by use of the timing charts shown in FIGS. 3A, 3B, 3C, and 3D, respectively.

FIG. 4A is a sectional view showing the laminated state of a silicon nitride film formed by use of the timing chart shown in FIG. 3A. As shown in FIG. 4A, an SiN film formed by use of plasma (i.e., a plasma SiN film 100A) and an SiN film formed by thermal decomposition without using plasma (i.e., a thermal SiN film 100B) are alternately laminated on the surface of a wafer W one by one. This is so, because the timing chart shown in FIG. 3A is arranged to alternately repeat a plurality of times the plasma cycle ECL and non-plasma cycle NCL one by one (the mixture ratio=1:1).

The process conditions of the film formation process are as follows. The flow rate of DCS gas is set to be within a range of 50 to 2,000 sccm, e.g., at 1,000 sccm (1 slm). The flow rate of $NH_3$ gas is set to be within a range of 500 to 5,000 sccm, e.g., at 1,000 sccm. The process temperature is lower than ordinary CVD processes, and is set to be within a range of 200 to 700° C., preferably of 300 to 700° C., and more preferably of 450 to 630° C. If the process temperature is lower than 200°

C., essentially no film is deposited because hardly any reaction is caused. If the process temperature is higher than 700° C., a low quality CVD film is deposited, and existing films, such as a metal film, suffer thermal damage. The temperature of the process field 5 may be changed to some extent depending on the presence and absence of plasma in the plasma and non-plasma cycles ECL and NCL. However, the heating temperature set by the heater 86 to the process field 5 remains essentially the same in the plasma and non-plasma cycles ECL and NCL.

The process pressure is set to be within a range of 13 Pa (0.1 Torr) to 13,300 Pa (100 Torr), preferably of 40 Pa (0.3 Torr) to 266 Pa (2 Torr), and more preferably of 93 P (0.7 Torr) to 107 Pa (0.8 Torr). For example, the process pressure is set at 1 Torr during the first step (DCS supply step) T1, and at 0.3 Torr during the third step (NH$_3$ supply step) T3. If the process pressure is lower than 13 Pa, the film formation rate becomes lower than the practical level. Where the process pressure does not exceed 13,300 Pa, the reaction mode on the wafers W is mainly of an adsorption reaction, and thus a high quality thin film can be stably deposited at a high film formation rate, thereby attaining a good result. However, if the process pressure exceeds 13,300 Pa, the reaction mode is shifted from the adsorption reaction to a vapor-phase reaction, which then becomes prevailing on the wafers W. This is undesirable, because the inter-substrate uniformity and planar uniformity of the film are deteriorated, and the number of particles due to the vapor-phase reaction suddenly increases.

<Modifications>

Figure 3B:
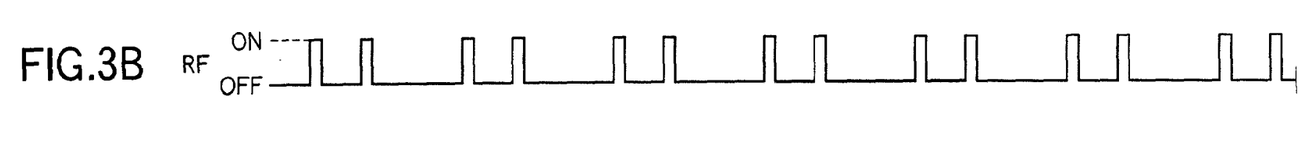
FIGS. 3B, 3C, and 3D are timing charts showing the RF (radio frequency) application of film formation methods according to modifications.
Figure 3C:
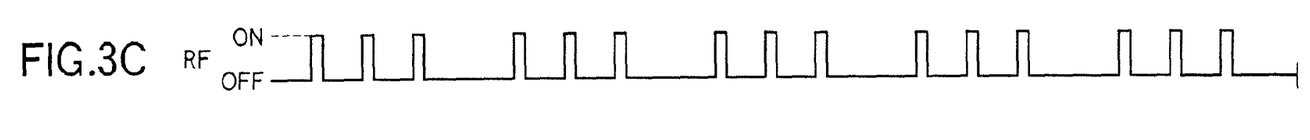
Figure 3D:
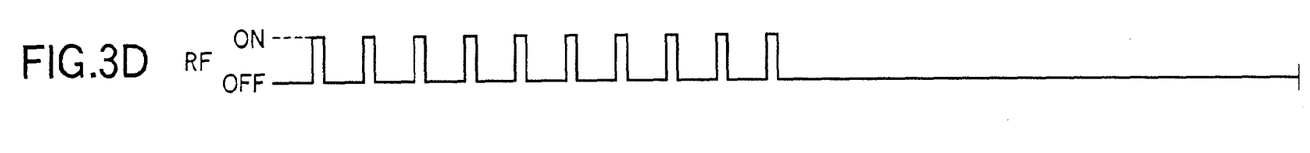
Figure 4B:
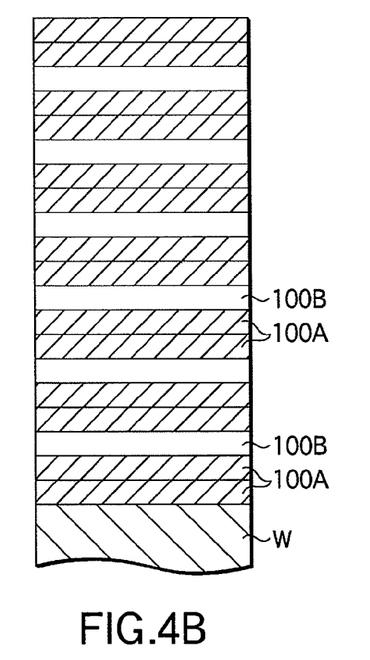
Figure 4C:
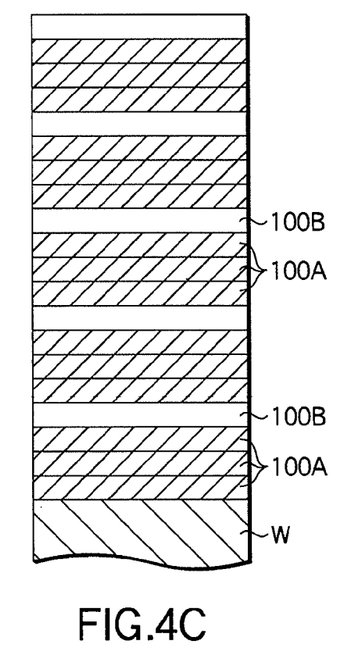
Figure 4D:
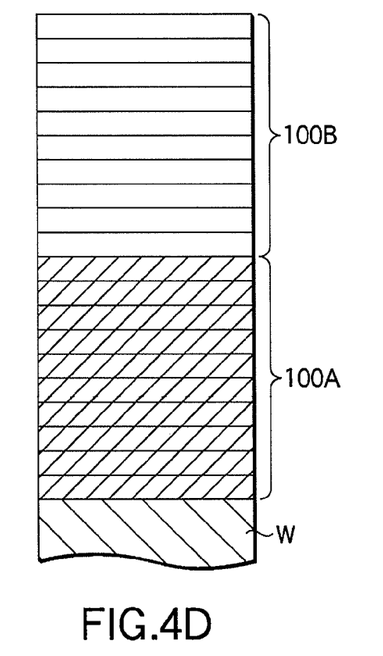

FIGS. 3B, 3C, and 3D are timing charts showing the RF (radio frequency) application of film formation methods according to modifications. In these drawings, the positions of RF pulses correspond to the positions of NH$_3$ pulses shown in FIG. 3A. FIGS. 4B, 4C, and 4D are sectional views showing the laminated state of a silicon nitride film formed by use of the timing charts shown in FIGS. 3B, 3C, and 3D, respectively.

In the modification shown in FIG. 3B, the RF pulse synchronized with the NH$_3$ pulse is cancelled once every three times. In other words, for the third step (NH$_3$ supply step) T3, a set of two RF-ON states and one RF-OFF state are alternately repeated. Consequently, a cycle set formed of two plasma cycles ECL and one non-plasma cycle NCL are alternately repeated a plurality of times (the mixture ratio=2:1). In this case, as shown in FIG. 4B, a set of two SiN films formed by use of plasma (i.e., plasma SiN films 100A) and one SiN film formed by thermal decomposition without using plasma (i.e., a thermal SiN film 100B) are alternately laminated on the surface of a wafer W.

In the modification shown in FIG. 3C, the RF pulse synchronized with the NH$_3$ pulse is cancelled once every four times. In other words, for the third step (NH$_3$ supply step) T3, a set of three RF-ON states and one RF-OFF state are alternately repeated. Consequently, a cycle set formed of three plasma cycles ECL and one non-plasma cycle NCL are alternately repeated a plurality of times (the mixture ratio=3:1). In this case, as shown in FIG. 4C, a set of three plasma SiN films 100A and one thermal SiN film 100B are alternately laminated on the surface of a wafer W.

The timing charts shown in FIGS. 3A to 3C are arranged to alternately repeat the plasma cycle ECL and non-plasma cycle NCL at a mixture ratio of 1:1 to 1:3. However, these are merely examples, and the mixture ratio can be variously changed in accordance with a target value of a film quality factor. In other words, in accordance with the number N(N is a positive integer of 2 or more) of repetitions of the third step (NH$_3$ supply step) T3, the mixture ratio can be set at any ratio within a range of 1:N−1 to N−1:1.

In the modification shown in FIG. 3D, the RF pulse synchronized with the NH$_3$ pulse is applied ten times in a row and is then cancelled ten times in a row. In other words, for the third step (NH$_3$ supply step) T3, a set of ten RF-ON states and a set of ten RF-OFF states are alternately repeated. Consequently, a cycle set formed of ten plasma cycles ECL and a cycle set formed of ten non-plasma cycle NCL are alternately repeated a plurality of times (the mixture ratio=1:1). In this case, as shown in FIG. 4D, a set of ten plasma SiN films 100A and a set of ten thermal SiN films 100B are alternately laminated on the surface of a wafer W.

As in this modification, the cycle mixture manner may be arranged to alternately perform a first cycle set formed of one or more plasma cycles and a second cycle set formed of one or more non-plasma cycles.

<Experiment>

As present examples PE1, PE2, and PE3 according to the embodiment described above and comparative examples CE1 and CE2, a silicon nitride film was formed in the apparatus shown in FIG. 1 by film formation methods respectively using different mixture manners of the plasma and non-plasma cycles, and then the film thus formed was examined. In the present examples PE1, PE2, and PE3, plasma excitation for the third step (NH$_3$ supply step) T3 of the respective cycles was set in accordance with the timing charts of FIGS. 3A, 3B, and 3C, respectively. In the comparative example CE1, plasma excitation was unused for the third step (NH$_3$ supply step) T3 of all the cycles (RF-ON=0%). In the comparative example CE2, plasma excitation was used for the third step (NH$_3$ supply step) T3 of all the cycles (RF-ON=100%). In this experiment, the process conditions described above were employed as the reference for the film formation process, while the film formation temperature was set at 630° C. and the target film thickness was set at about 50 nm. Wafers placed at TOP (top), CTR (center), and BTM (bottom) of the wafer boat 12 were used as measurement wafers.

Figure 5:
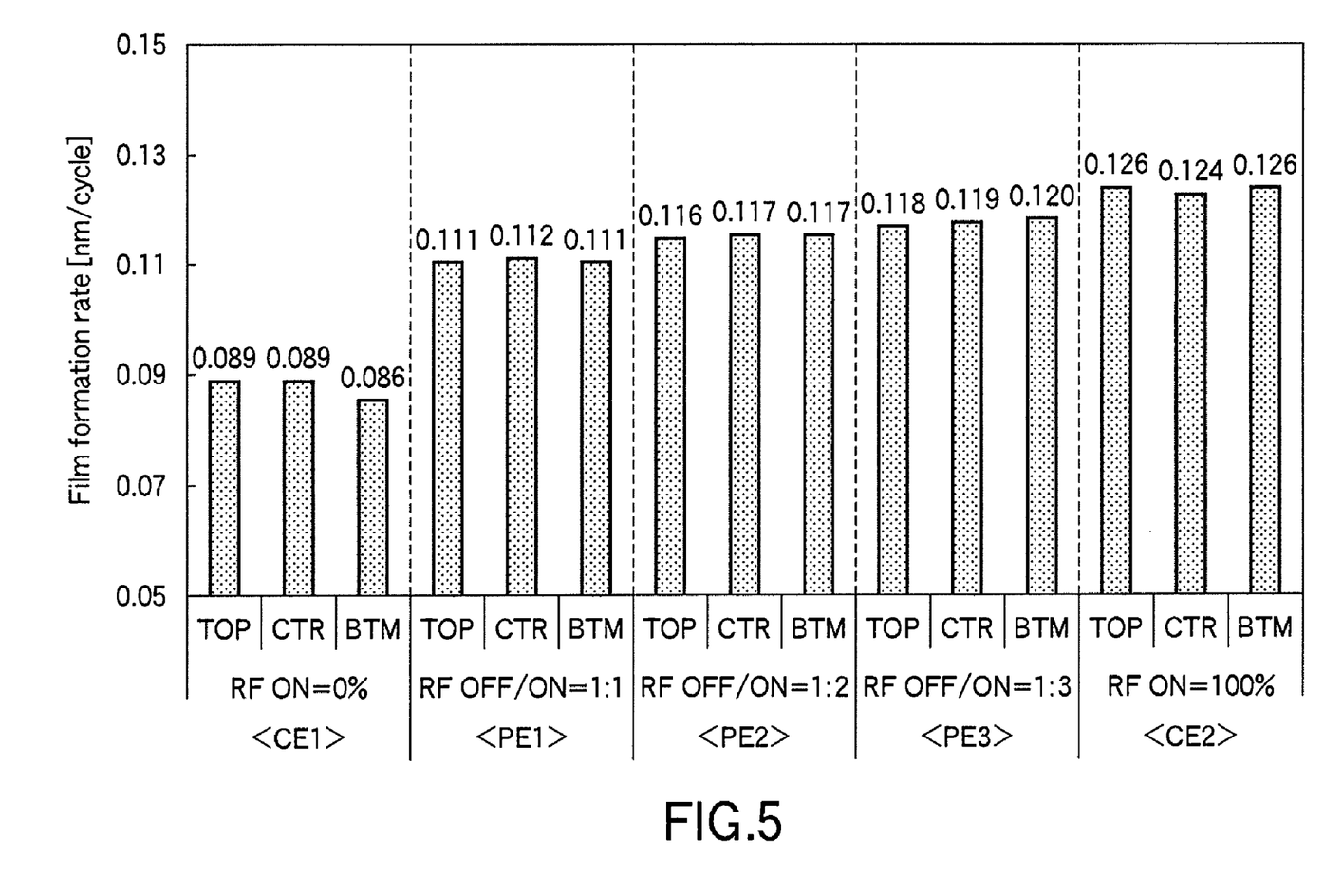
FIG. 5 is a graph showing the relationship of the film formation rate of a silicon nitride film in one cycle relative to the mixture manner of plasma and non-plasma cycles.

FIG. 5 is a graph showing the relationship of the film formation rate of a silicon nitride film in one cycle relative to the mixture manner of plasma and non-plasma cycles. The comparative example CE1 (ON=0%) caused the film formation rate to be lowest with a value of about 0.089 nm. The present examples PE1, PE2, and PE3 caused the film formation rate to be higher with an increase in the ratio of the plasma cycle such that the present examples PE1, PE2, and PE3 rendered values of about 0.111 nm, 0.117 nm, and 0.119 nm, respectively. The comparative example CE2 (ON=100%) caused the film formation rate to be highest with a value of about 0.126 nm. Accordingly, it has been found that the film formation rate of the silicon nitride film can be controlled in relation to plasma-promoted nitridation by adjusting the mixture ratio of the plasma cycle relative to the non-plasma cycle.

Figure 6:
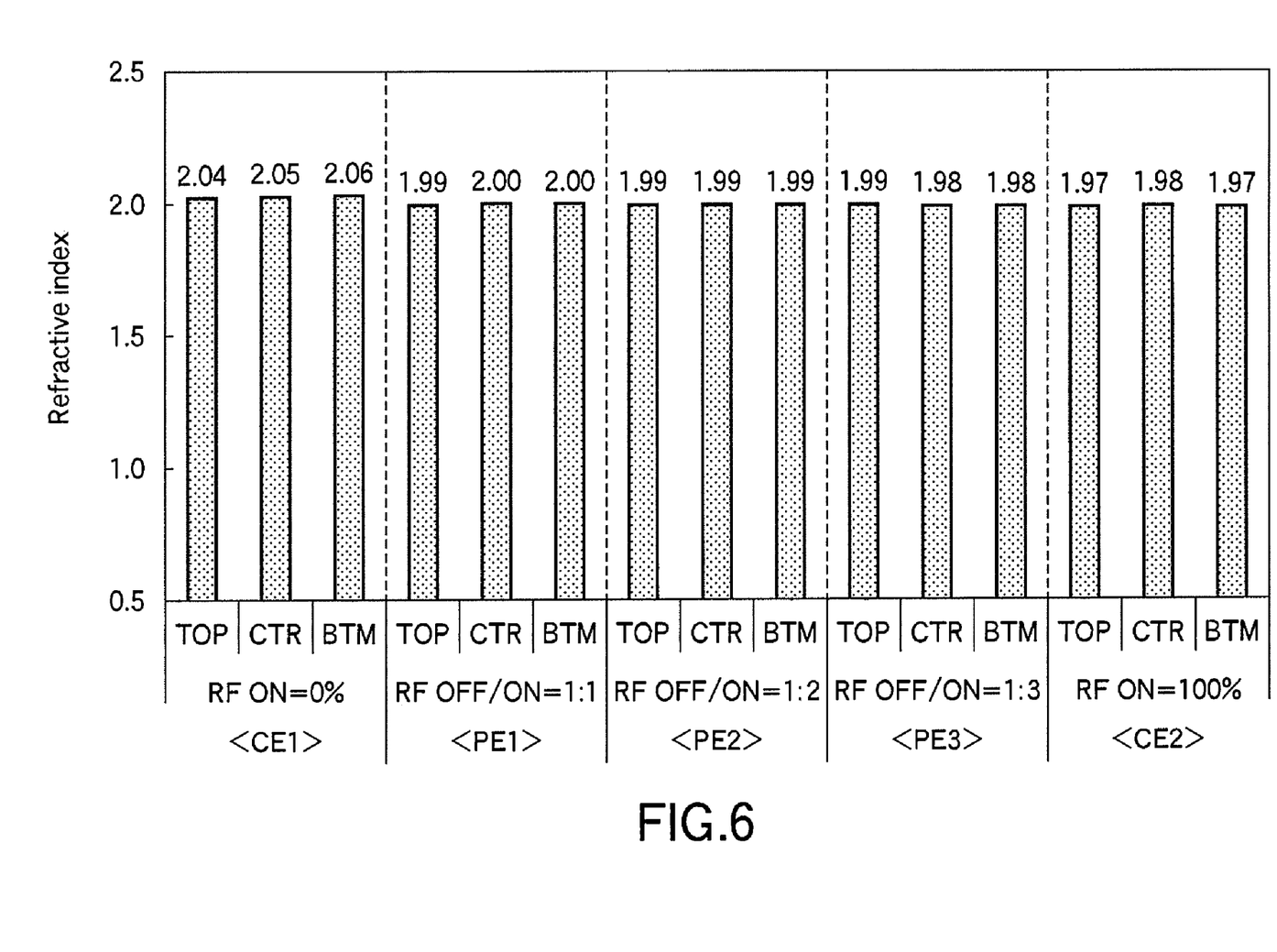
FIG. 6 is a graph showing the relationship of the refractive index of a silicon nitride film relative to the mixture manner of plasma and non-plasma cycles.

FIG. 6 is a graph showing the relationship of the refractive index of a silicon nitride film relative to the mixture manner of plasma and non-plasma cycles. The comparative example CE1 (ON=0%) caused the refractive index to be highest with a value of about 2.05. The present examples PE1, PE2, and PE3 caused the refractive index to be lower slightly but reliably with high accuracy with an increase in the ratio of the plasma cycle such that the present examples PE1, PE2, and PE3 rendered values of about 2.00, 1.99, and 1.98, respectively. The comparative example CE2 (ON=100%) caused the refractive index to be lowest with a value of about 1.97. Accordingly, it has been found that the refractive index of a silicon nitride film can be controlled with very high accuracy by adjusting the mixture ratio of the plasma cycle relative to the non-plasma cycle.

The refractive index of a silicon nitride film depends on the ratio of N atoms relative to Si atoms in the silicon nitride film, which is a composition ratio of the film. As the ratio of N atoms relative to Si atoms is higher, the refractive index is lower, and so the ratio of N atoms relative to Si atoms can be controlled to be higher by adjusting the ratio of the plasma cycle to be higher. Even if a change in the refractive index is very small, this small change largely affect the composition ratio. Accordingly, it is preferable to control the refractive index with high accuracy in the film formation process.

Figure 7:
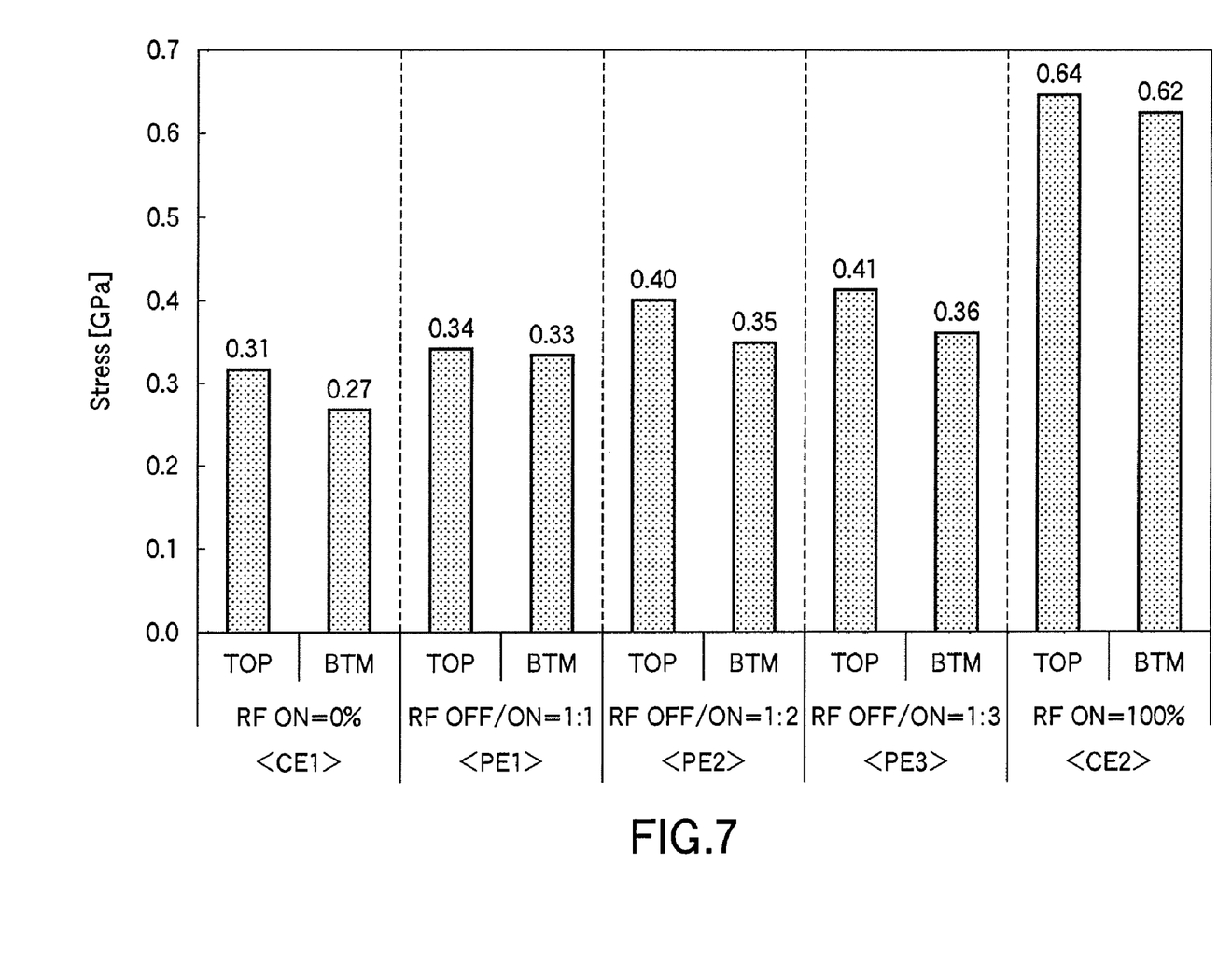
FIG. 7 is a graph showing the relationship of the stress of a silicon nitride film relative to the mixture manner of plasma and non-plasma cycles.

FIG. 7 is a graph showing the relationship of the stress of a silicon nitrile film relative to the mixture manner of plasma and non-plasma cycles. The comparative example CE1 (ON=0%) caused the stress to be lowest with a value of about 0.27 to 0.31 GPa. The present examples PE1, PE2, and PE3 caused the stress to be higher slightly but reliably with high accuracy with an increase in the ratio of the plasma cycle such that the present examples PE1, PE2, and PE3 rendered a value of about 0.33 to 0.34 GPa, a value of about 0.35 to 0.40 GPa, and a value of about 0.36 to 0.41 GPa, respectively. The comparative example CE2 (ON=100%) caused the stress to be highest with a value of about 0.62 to 0.64 GPa. Accordingly, it has been found that the stress of a silicon nitride film can be controlled with very high accuracy by adjusting the mixture ratio of the plasma cycle relative to the non-plasma cycle. As described above, the stress has a large effect on the mobility of electrons or holes.

<Execution Sequence of Film Formation Method>

As described above, according to this embodiment, there is provided a method for performing a film formation process in accordance with the following sequence. Specifically, a relation formula or relation table is first obtained, which represents the relationship of the cycle mixture manner of the plasma and non-plasma cycles relative to a film quality factor of the silicon nitride film. For example, the film quality factor may be selected from the group consisting of the refractive index, the composition ratio of N atoms relative to Si atoms, and the stress, as described above. The relation formula or the relation table of this kind can be obtained by an experiment performed in advance. Then, based on a target value of the film quality factor, such as refractive index, composition ratio, and stress, a specific manner of the cycle mixture manner is determined with reference to the relation formula or relation table. Then, the film formation process is arranged in accordance with the specific manner of the cycle mixture manner, and is performed as described above.

As regards the operations of determining a specific manner of the cycle mixture manner and arranging the film formation process in accordance with the specific manner, a process operator can manually perform these operations, but the control section 60 of the film formation apparatus 2 may be used to automatically perform these operations. Specifically, in the latter case, the relation formula or relation table obtained as described above is stored in a storage section from which the control section 60 can retrieve data, such as the storage section 62, in advance. In this case, the control section 60 is preset to access the storage section to retrieve data concerning the relation formula or relation table in response to an input of a target value of a film quality factor, and to determine a specific manner of the cycle mixture manner based on the input target value with reference to the relation formula or relation table. Further, the control section 60 is preset to arrange the film formation process in accordance with the specific manner and then to control the apparatus to execute the film formation process.

As shown in the experiment data described above, where the film quality factor is the refractive index of a silicon nitride film, the mixture ratio of the plasma cycle relative to the non-plasma cycle is set smaller with an increase in the target value. Where the film quality factor is the composition ratio of a silicon nitride film (the ratio of N atoms relative to Si atoms), the mixture ratio of the plasma cycle relative to the non-plasma cycle is set larger with an increase in the target value. Where the film quality factor is the stress of a silicon nitride film, the mixture ratio of the plasma cycle relative to the non-plasma cycle is set larger with an increase in the target value.

The cycle mixture manner may be arranged to alternately perform a first cycle set formed of one or more cycles each being the plasma cycle and a second cycle set formed of one or more cycles each being the non-plasma cycle.

<Other Modifications>

In the embodiment described above, for example, the first process gas contains DCS gas as a silane family gas. In this respect, the silane family gas may contain at least one gas selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertial-butylaminosilane (BTBAS), trimethylsilane (TMS), dimethylsilane (DMS), monomethylsilane (MMS), and tridimethylaminosilane (3DMAS).

In the embodiment described above, for example, the second process gas contains $NH_3$ gas as a nitriding gas. In this respect, the nitriding gas may contain at least one gas selected from the group consisting of ammonia ($NH_3$), nitrogen ($N_2$), dinitrogen oxide ($N_2O$), and nitrogen oxide (NO).

In the embodiment described above, a silicon nitride film to be formed may be provided with components, such as boron (B) and/or carbon (C). In this case, each cycle of the film formation process further comprises a step or steps of supplying a doping gas and/or a carbon hydride gas. A boron-containing gas used for doping boron may contain at least one gas selected from the group consisting of $BCl_3$, $B_2H_6$, $BF_3$, and $B(CH_3)_3$. A carbon hydride gas used for adding carbon may contain at least one gas selected from the group consisting of acetylene, ethylene, methane, ethane, propane, and butane.

Also, in the embodiments described above, the second supply step of the plasma cycle further can include a period of supplying the second process gas (ammonia) to the process field while not exciting (generating plasma of) the second process gas by the (plasma) exciting mechanism, before the excitation period.

A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process requiring formation of a silicon nitride film on a plurality of target substrates supported at intervals in a vertical direction on a support member in a process field inside a process container configured to be selectively supplied with a silicon source gas and ammonia gas and communicating with a plasma exciting mechanism for generating plasma of the ammonia gas to be supplied, the film formation process repeating a plasma cycle and a non-plasma cycle a plurality of times in the process field with the target substrates placed therein to laminate thin films thereby formed on the target substrates, so as to form a silicon nitride film with a predetermined thickness, wherein each of the plasma cycle and the non-plasma cycle includes, in the order, a first supply step of performing supply of the silicon source gas to the process field while maintaining a shut-off state of supply of the ammonia gas to the process field, a first intermediate step of exhausting gas from the process field while maintaining a shut-off state of supply of the silicon source gas and the ammonia gas to the process field, a second supply step of performing supply of the ammonia gas to the process field while maintaining a shut-off state of supply of the silicon source gas to the process field, and a second intermediate step of exhausting gas from the process field while maintaining a shut-off state of supply of the silicon source gas and the ammonia gas to the process field, wherein the plasma cycle is a cycle in which the second supply step includes an excitation period of supplying the ammonia gas to the process field while generating plasma of the ammonia gas by the plasma exciting mechanism, the non-plasma cycle is a cycle in which the second supply step includes no period of generating plasma of the ammonia gas by the exciting mechanism, the plasma cycle and the non-plasma cycle use essentially the same set temperature for heating the process field to set the process field at a process temperature of 200 to 700° C. through the plasma cycle and the non-plasma cycle, and the plasma cycle and the non-plasma cycle set the process field at a process pressure of 13 Pa (0.1 Torr) to 13,300 Pa (100 Torr) during the first and second supply steps, the method comprising:

obtaining a relation formula or relation table from a combination of examples found by experiments of the film formation process, the relation formula or relation table representing a relationship of a cycle mixture ratio of the plasma cycle to the non-plasma cycle relative to a stress of the silicon nitride film, and the combination of the examples satisfying a premise that the stress increases with an increase in the cycle mixture ratio;

then selecting specific conditions of the film formation process for forming a product silicon nitride film, while determining a specific value of the cycle mixture ratio to be used for the product silicon nitride film based on a target stress value of the product silicon nitride film with reference to the relation formula or relation table; and then performing the film formation process in accordance with the specific conditions to form the product silicon nitride film having the target stress value.

2. The method according to claim 1, wherein, in the specific conditions, the specific value of the cycle mixture ratio is set by alternately performing a first cycle set formed of one or more cycles each being the plasma cycle and a second cycle set formed of one or more cycles each being the non-plasma cycle.

3. The method according to claim 2, wherein the number of cycles forming the first cycle is set is larger than the number of cycles forming the second cycle set to define the specific value of the cycle mixture ratio.

4. The method according to claim 1, wherein each of the plasma cycle and the non-plasma cycle continuously exhausts gas from the process field through the first supply step, the first intermediate step, the second supply step, and the second intermediate step.

5. The method according to claim 1, wherein each of the first and second intermediate steps of the plasma cycle and the non-plasma cycle includes a period of supplying a purge gas to the process field.

6. The method according to claim 1, wherein the second supply step of the plasma cycle further includes a period of supplying the ammonia gas to the process field while not generating plasma of the ammonia gas by the plasma exciting mechanism, before the excitation period.

7. The method according to claim 1, wherein the silicon source gas contains at least one gas selected from the group consisting of dichlorosilane, hexachlorodisilane, monosilane, disilane, hexamethyldisilazane, tetrachlorosilane, disilylamine, trisilylamine, bistertialbutylaminosilane, trimethylsilane, dimethylsilane, monomethylsilane, and tridimethylaminosilane.

8. The method according to claim 1, wherein the method further comprises storing data of the relation formula or relation table in a storage section, such that a control section retrieves the data from the storage section and determines the specific value of the cycle mixture ratio.

9. The method according to claim 8, wherein the film formation process is performed under control of the control section in accordance with the specific conditions to form the product silicon nitride film.

10. The method according to claim 1, wherein the process temperature is set at a temperature of 450 to 630° C.

11. The method according to claim 10, wherein the process pressure is set at a pressure of 40 Pa (0.3 Torr) to 266 Pa (2 Torr).

12. The method according to claim 11, wherein the target stress value is 0.35 GPa or more, and the specific value of the cycle mixture ratio is 2 or more.

* * * * *